(12) United States Patent
Lowe et al.

(10) Patent No.: US 10,826,202 B1
(45) Date of Patent: Nov. 3, 2020

(54) CONNECTORS FOR LINEAR LIGHTING

(71) Applicant: Elemental LED, Inc., Reno, NV (US)

(72) Inventors: J. B. Lowe, Reno, NV (US); Travis Irons, Reno, NV (US); Matthew John, Reno, NV (US)

(73) Assignee: Elemental LED, Inc., Reno, NV (US)

( * ) Notice: Subject to any disclaimer, the term of this patent is extended or adjusted under 35 U.S.C. 154(b) by 0 days.

(21) Appl. No.: 16/911,142

(22) Filed: Jun. 24, 2020

(51) Int. Cl.
| | |
|---|---|
| *F21V 23/06* | (2006.01) |
| *H01R 4/38* | (2006.01) |
| *F21S 4/00* | (2016.01) |
| *H01R 11/09* | (2006.01) |
| *H01R 11/03* | (2006.01) |
| *F21Y 103/10* | (2016.01) |
| *F21Y 115/10* | (2016.01) |
| *H01R 27/02* | (2006.01) |
| *F21V 21/005* | (2006.01) |
| *H01R 4/36* | (2006.01) |
| *H01R 9/24* | (2006.01) |
| *H01R 33/94* | (2006.01) |
| *H01R 25/14* | (2006.01) |
| *H05K 1/14* | (2006.01) |

(52) U.S. Cl.
CPC .............. *H01R 4/38* (2013.01); *F21S 4/00* (2013.01); *F21V 23/06* (2013.01); *H01R 11/03* (2013.01); *H01R 11/09* (2013.01); *F21V 21/005* (2013.01); *F21Y 2103/10* (2016.08); *F21Y 2115/10* (2016.08); *H01R 4/363* (2013.01); *H01R 9/24* (2013.01); *H01R 25/145* (2013.01); *H01R 27/02* (2013.01); *H01R 33/94* (2013.01); *H05K 1/142* (2013.01)

(58) Field of Classification Search
CPC ........ H01R 27/02; H01R 33/94; H01R 4/363; H01R 4/46; H01R 9/24; H01R 25/145; F21V 23/06; F21V 21/005; H05K 1/142
See application file for complete search history.

(56) References Cited

U.S. PATENT DOCUMENTS

| | | |
|---|---|---|
| 264,299 A | 9/1882 | Johnson |
| 3,629,806 A | 12/1971 | Wiechmann |
| 3,670,290 A | 6/1972 | Angele et al. |
| 4,213,669 A * | 7/1980 | Wittes .................. H01R 4/36 439/811 |
| 4,768,969 A | 9/1988 | Bauer et al. |
| 4,952,177 A | 8/1990 | Drake et al. |

(Continued)

FOREIGN PATENT DOCUMENTS

| | | |
|---|---|---|
| DE | 1018495 B | 10/1957 |
| EP | 1852941 A1 | 11/2007 |

(Continued)

*Primary Examiner* — Tho D Ta
(74) *Attorney, Agent, or Firm* — United IP Counselors, LLC

(57) ABSTRACT

Connectors for linear lighting are disclosed. These connectors are adapted to electrically connect two strips of linear lighting, or a single strip of linear lighting and an appropriate number of wires. At least the portions of the connectors that accept the strips of linear lighting have sloped ramps that provide strain relief to the strips of linear lighting. Additionally, pivoting connectors that allow their sides to rotate relative to one another are disclosed.

13 Claims, 12 Drawing Sheets

(56) References Cited

U.S. PATENT DOCUMENTS

| | | | |
|---|---|---|---|
| 4,983,132 A * | 1/1991 | Weidler | H01R 25/162 |
| | | | 439/251 |
| 5,013,265 A * | 5/1991 | Buchter | H01R 13/113 |
| | | | 439/724 |
| 5,336,100 A | 8/1994 | Gabrius et al. | |
| 5,848,837 A | 12/1998 | Gustafson | |
| 6,093,037 A | 7/2000 | Lin | |
| 6,273,587 B1 | 8/2001 | Demshki | |
| 6,283,612 B1 | 9/2001 | Hunter | |
| 6,358,070 B1 | 3/2002 | Lin | |
| 6,530,791 B1 * | 3/2003 | Hierzer | H01R 25/145 |
| | | | 439/115 |
| 6,802,748 B2 | 10/2004 | Wertz et al. | |
| 7,175,303 B2 | 2/2007 | Kovacik et al. | |
| 7,473,006 B1 | 1/2009 | Bollman | |
| 7,758,358 B1 * | 7/2010 | Mier-Langner | H01R 35/04 |
| | | | 439/115 |
| 3,231,261 A1 | 7/2012 | Gherardini et al. | |
| 3,297,788 A1 | 10/2012 | Bishop | |
| 8,297,788 B2 * | 10/2012 | Bishop | F21V 23/06 |
| | | | 362/249.02 |
| 3,454,193 A1 | 8/2013 | Simon et al. | |
| 8,714,772 B1 | 5/2014 | Levante et al. | |
| 8,979,296 B2 | 3/2015 | Wiemer et al. | |
| 9,206,964 B2 | 12/2015 | Marsh et al. | |
| 9,239,136 B1 | 1/2016 | Petersen et al. | |
| 9,374,856 B2 | 6/2016 | Winton | |
| 10,458,638 B1 * | 10/2019 | Tirosh | F21V 23/04 |
| 10,591,114 B1 * | 3/2020 | Lassen | F21V 15/013 |
| 2002/0004336 A1 | 1/2002 | Yamaguchi | |
| 2002/0106931 A1 | 8/2002 | Hsien-Te | |
| 2003/0184204 A1 | 10/2003 | McCoy et al. | |
| 2004/0115984 A1 | 6/2004 | Rudy et al. | |
| 2005/0174808 A1 | 8/2005 | Butsch et al. | |
| 2005/0215108 A1 | 9/2005 | Chen | |
| 2005/0260874 A1 | 11/2005 | Murakami et al. | |
| 2006/0197474 A1 | 9/2006 | Olsen | |
| 2009/0064571 A1 | 3/2009 | Fakhari | |
| 2010/0008090 A1 | 1/2010 | Li et al. | |
| 2012/0002417 A1 | 1/2012 | Li | |
| 2012/0075863 A1 | 3/2012 | Chen | |
| 2013/0249394 A1 | 9/2013 | Fay | |
| 2014/0218924 A1 | 8/2014 | Levante et al. | |
| 2015/0077998 A1 | 3/2015 | Zhang | |
| 2015/0117005 A1 | 4/2015 | Zanotto et al. | |
| 2015/0285472 A1 | 10/2015 | Evitt | |
| 2015/0303632 A1 | 10/2015 | Tremaine et al. | |
| 2018/0287272 A1 | 10/2018 | Garton et al. | |

FOREIGN PATENT DOCUMENTS

| | | | |
|---|---|---|---|
| EP | 2075875 A1 * | 7/2009 | |
| EP | 2075875 A1 | 7/2009 | |
| EP | 2078895 B1 | 12/2012 | |
| FR | 2234675 A1 * | 1/1975 | |
| KR | 20140031039 A | 3/2014 | |
| WO | 2013010445 A1 | 1/2013 | |

* cited by examiner ical field
The invention relates to connectors for linear lighting.

BACKGROUND

Linear lighting is a particular class of solid-state lighting that uses light-emitting diodes (LED). In this type of lighting, a long, narrow printed circuit board (PCB) is populated with LED light engines, usually spaced at a regular pitch or spacing. The PCB may be either rigid or flexible, and other circuit components may be included on the PCB, if necessary. Depending on the type of LED light engine or engines that are used, the linear lighting may emit a single color, or may be capable of emitting multiple colors.

Traditionally, linear lighting is connected to power by soldering wires to solder pads provided on the PCB. While these sorts of connections are considered to be reliable, soldering takes practice and is best done under controlled conditions by a skilled technician. A poor solder joint can quickly fail and, in extreme cases, result in the destruction of the PCB. Even someone skilled at soldering may have difficulty making good solder joints while attempting to install linear lighting in a cramped space.

Reliable solderless connectors are still emerging in the market and are suitable for a range of applications in which soldering is undesirable or impractical. U.S. Pat. No. 10,591,114, the work of the present assignee and incorporated by reference herein in its entirety, is one example of a type of solderless connector for connecting linear lighting to either wire or another strip of linear lighting.

Despite the emergence of solderless connectors, there are still potential issues with their design. For example, many connectors receive the strip of linear lighting in a raised slot. The vertical height of the raised slot may induce strain in the linear lighting and create non-uniform light output near the connector. Additionally, connectors such as those disclosed in the '114 patent provide for linear, end-to-end connections, and do not allow an angle between the connected strips of linear lighting.

BRIEF SUMMARY

One aspect of the invention relates to connectors for connecting a strip of linear lighting to wires or to another strip of linear lighting. The connector includes a connector body with contact members positioned inside. The contact members span the connector body to connect one end to the other. Depending on the embodiment, the ends of the contact members are adapted either to connect to solder pads or other such contacts on a strip of linear lighting, or to wires. If the contact members are adapted to connect to wires, upper clips extending downwardly from an interior upper portion of the connector body may be biased downwardly by screws to press the wires against the contact members in order to make electrical contact. If the contact members are adapted to connect to linear lighting, the ends of the contact members may comprise tongues, under which the strip of linear lighting is slid. The tongues may be biased toward engagement with the strip of linear lighting by screws. On at least the side of the connector body that receives linear lighting, a ramp extends outwardly from the body in alignment with the slot that receives the strip of linear lighting. The ramp has at least a slight downward angle, and may taper down in thickness as it extends away from the connector body. In some embodiments, both sides of the connector body may have ramps. The ramps may serve as strain relief, provide additional support to the joints, and potentially eliminate a "hot spot" in light emitted by the linear lighting near the connector body that might otherwise be caused by the height of the slot in which the linear lighting is received. The slot in which the linear lighting is received may itself be sufficiently tall so as not to obstruct the LED light engine nearest the slot.

Another aspect of the invention relates to a pivoting electrical connector for connecting between two strips of linear lighting or, in some embodiments, between a strip of linear lighting and wires. The connector has a first side and a second side which are connected by a pivoting joint. Each side of the connector has receiving structure similar to that described above, including at least a pair of conductive contact members in each side. The pivoting joint is arranged to keep the contact members from each side in electrical contact and communication with the corresponding electrical contact members in the other side while allowing for pivoting rotation of one side with respect to the other.

Yet another aspect of the invention relates to the structure of a pivoting joint, such as that described above, in a connector for linear lighting. In a pivoting joint of this type, contact members have a contact portion, which may be a tongue or a cage for connecting to linear lighting or wires, respectively, and a connecting portion. The connecting portion is a conductive annulus. The connecting portions for corresponding contact members are vertically stacked on one another, with a central insulating member positioned vertically in the stack between connecting portions of non-corresponding contact members to prevent electrical shorts. The contact members positioned toward the top of the stack may have vertical steps that allow their respective contact portions to extend along the same horizontal plane as the contact portions of contact members that are positioned lower in the stack. Other elements, like washers, may be positioned in the vertical stack of the pivoting joint in order to facilitate pivoting movement. A fastener inserts through the center of the stack, defining the axis of rotation of the pivoting joint.

Other aspects, features, and advantages of the invention will be set forth in the description that follows.

BRIEF DESCRIPTION OF THE DRAWING FIGURES

The invention will be described with respect to the following drawing figures, in which like numerals represent like features throughout the description, and in which.

DETAILED DESCRIPTION

Figure 1:
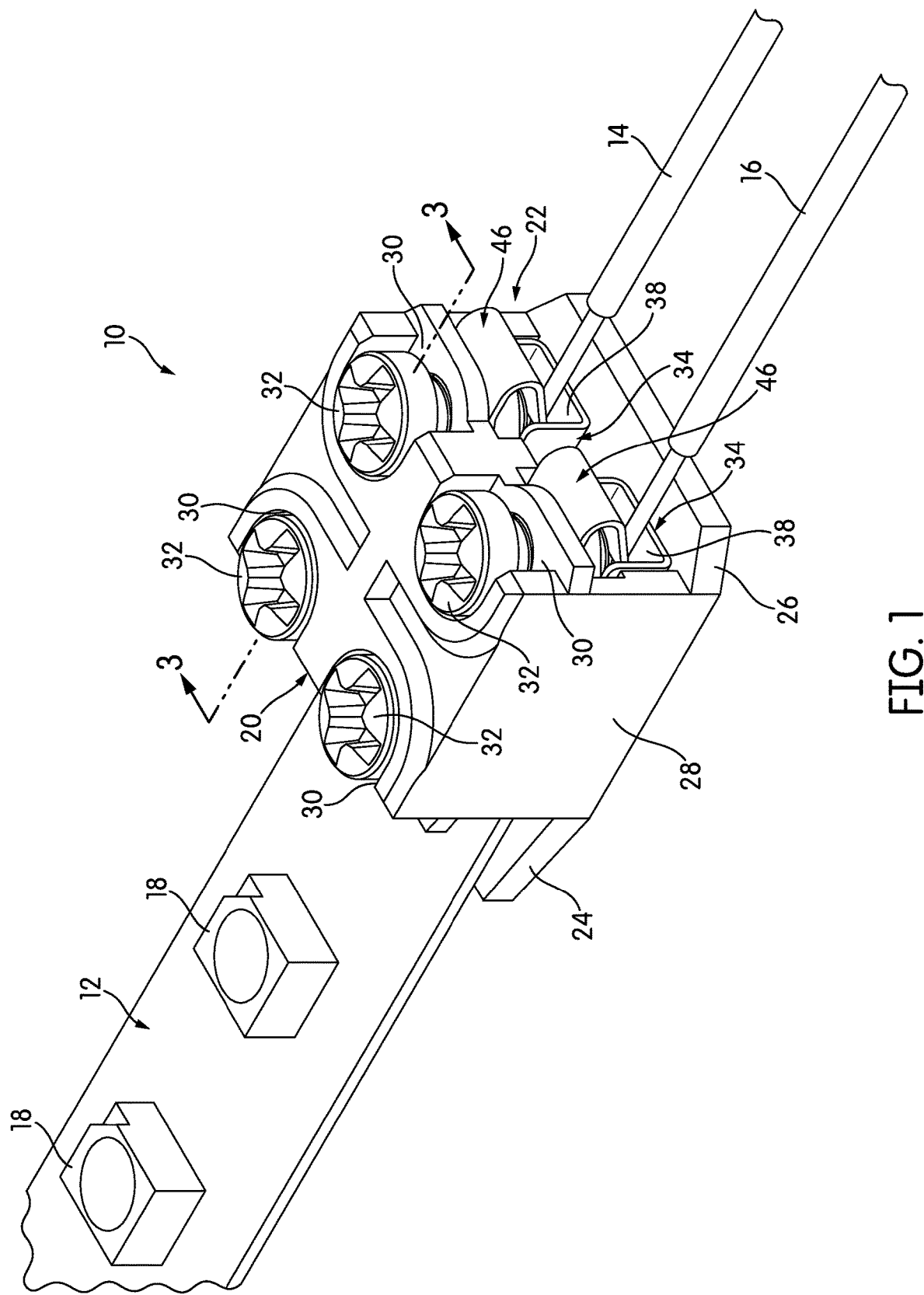
FIG. 1 is a perspective view of a connector for connecting wire to linear lighting according to one embodiment of the invention.

FIG. 1 is a perspective view of a connector, generally indicated at 10, according to one embodiment of the invention. The connector 10 is constructed and arranged to connect a strip of linear lighting 12 to wires 14, 16. In this case, there is a pair of wires 14, 16, but in other embodiments, there could be any number of wires. Typically, the wires 14, 16 would carry power to the linear lighting 12. However, the type of power or signal that the wires carry is not critical.

More specifically, the strip of linear lighting 12 has a plurality of LED light engines 18 mounted on it, spaced apart at a regular pitch or spacing. An LED light engine, as the term is used here, refers to one or more LEDs in a package suitable for mounting on a printed circuit board (PCB). The most common type of LED in LED light engines emits blue light. If the LED light engine is intended to emit "white" light, it is typically topped with a phosphor that absorbs the blue light (or whatever other color is emitted) and re-emits a broader spectrum of light. Some LED light engines have multiple, independently-controlled blue-emitting LEDs, each topped by a different phosphor. Other LED light engines have red-, green-, and blue-emitting (RGB) LEDs that are independently controlled to produce a variety of colors. Many of these types of LED light engines require additional signals for control and may thus require more wires. Connectors according to embodiments of the invention may accommodate more wires in other embodiments.

Much of this description will assume that the linear lighting 12 and the wires 14, 16 carry low voltage power. While the definition of "low voltage" varies depending on the authority one consults, for purposes of this description, voltages under about 50V will be considered to be low voltage. However, the connector 10 could carry high voltage in some embodiments.

The linear lighting 12 is received in a first side 20 of the connector 10. The wires 14, 16 are received in a second side 22 of the connector 10. The two sides 20, 22 are aligned with one another in linear fashion, such that the linear lighting 12 is linearly aligned with the wires 14, 16. Of course, the wires 14, 16 may be bent to extend in another direction.

As will be described below in more detail, the structures that receive the linear lighting 12 and the wires 14, 16 are elevated in relation to the surface on which the connector 10 rests. The height difference between the heights at which the components 12, 14, 16 are received and base surface height may be significant enough to induce strain in the linear lighting 12 or in the wires 14, 16. Additionally, the height difference may cause a "hot spot" or distinct difference in perceived light intensity for the LED light engines 18 closest to the connector 10, because those light engines 18 are slightly elevated in relation to the light engines 18 on the rest of the strip 12. In order to ameliorate these issues, each side 20, 22 has a lower portion that projects outwardly, in line with the linear lighting 12 and wires 14, 16, to form a sloped ramp 24, 26 that provides for a gradual height transition. As can be seen in FIG. 1, a short length of the linear lighting 12 closest to the connector 10 rests on the ramp 24, and a short length of each of the wires 14, 16 rests on the ramp 26. In the case of the wires 14, 16, the ramp 26 may also provide some protection against exposed areas of the wires 14, 16 shorting against the surface on which the connector 10 rests.

In the illustrated embodiment, the ramps 24, 26 have different lengths, with the ramp 24 extending from the first side 20 being somewhat longer than the other ramp 26. The angle of each ramp 24, 26 may be, e.g., on the order of 3-5° or more, although the two ramps 24, 26 need not make the same angle. Additionally, in the illustrated embodiment, the two ramps 24, 26 have only a slight taper in thickness as they extend away from the connector 10. However, in other cases, the thickness of each ramp may taper down more substantially as the ramp extends away from the connector 10.

Figure 2:
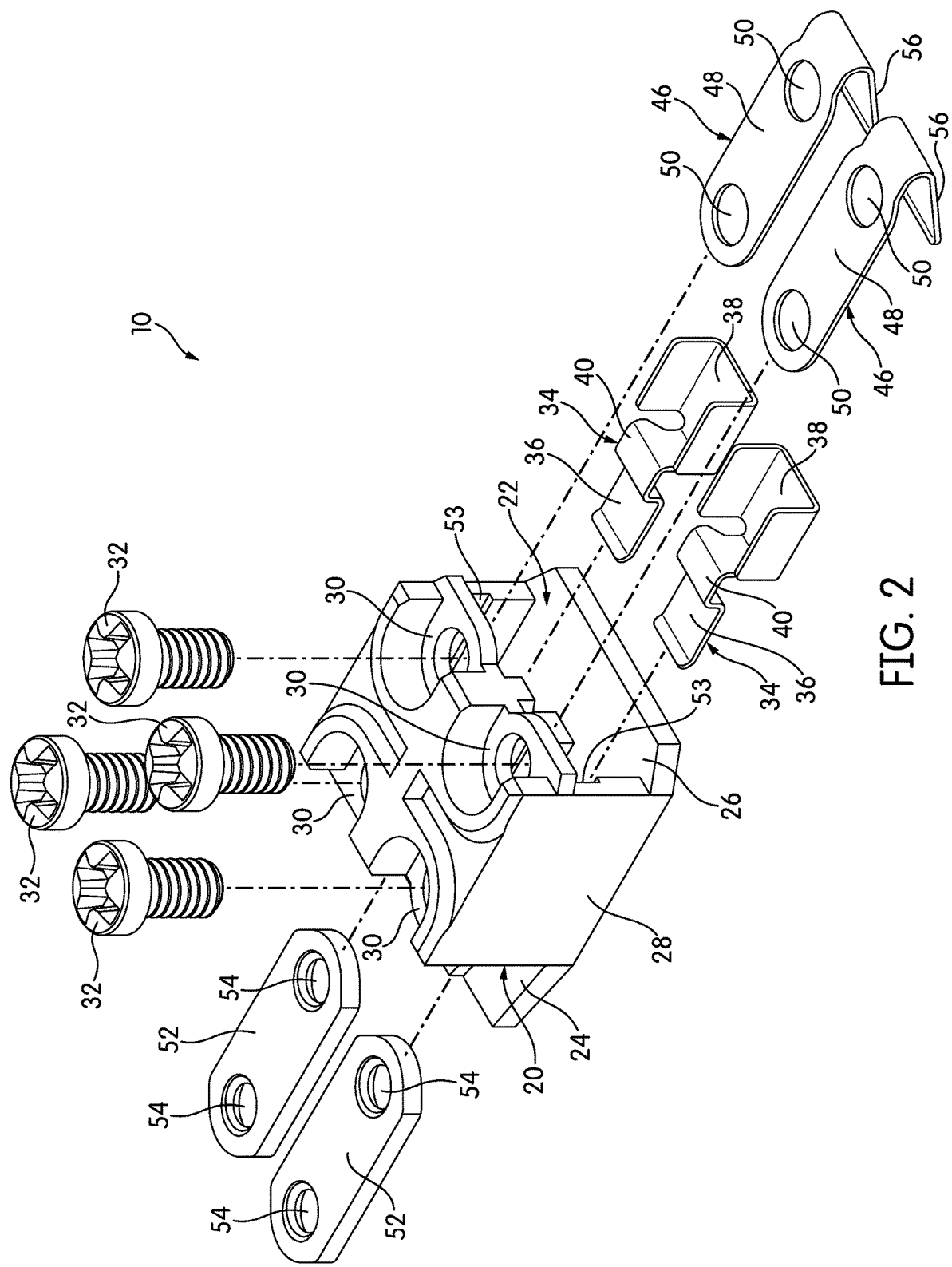
FIG. 2 is an exploded perspective view of the connector of FIG. 1.
Figure 3:
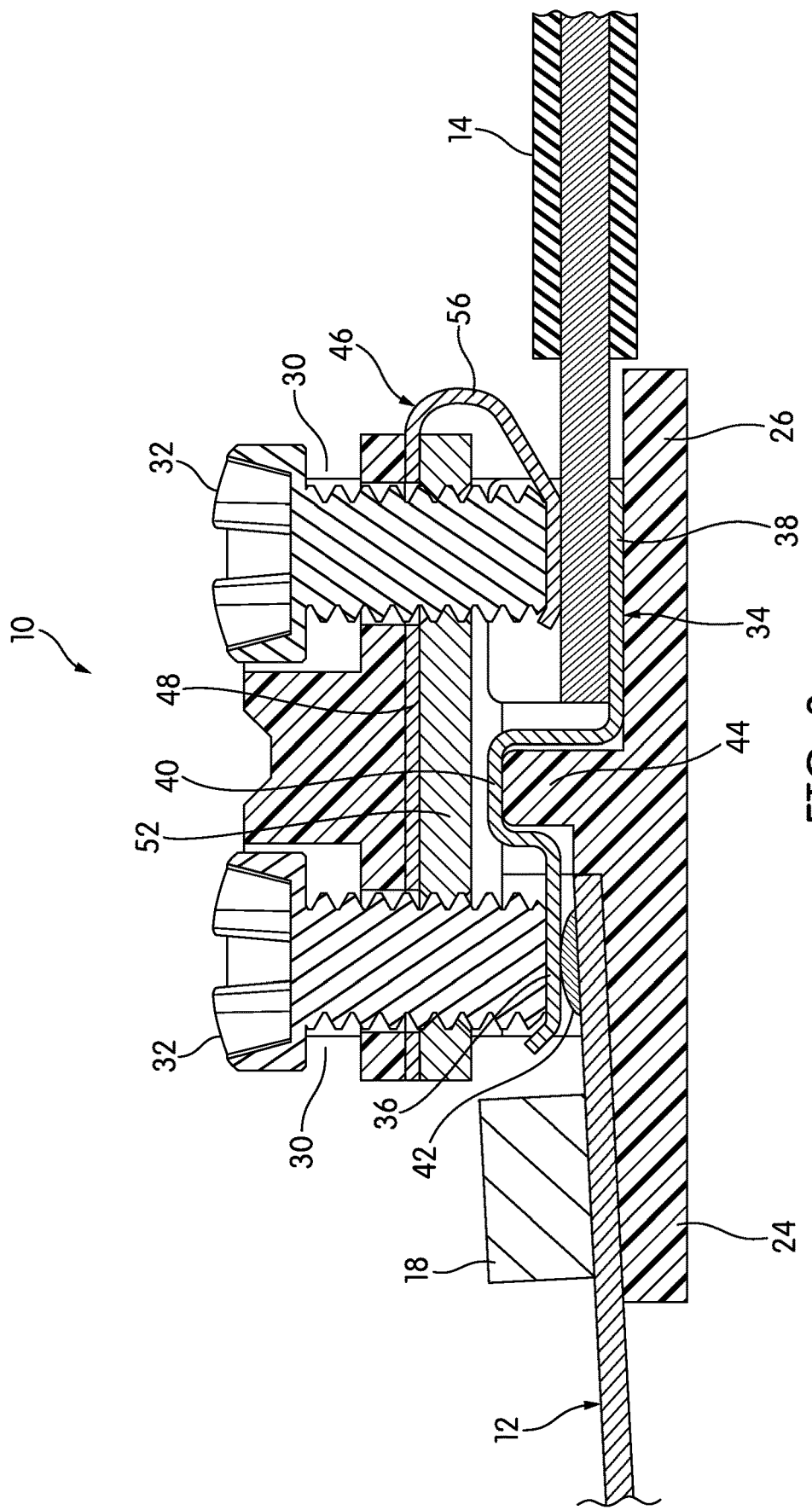
FIG. 3 is a cross-sectional view, taken through Line 3-3 of FIG. 1.

The components of the connector 10 can be seen in more detail in the exploded perspective view of FIG. 2, as well as in FIG. 3, a cross-sectional view taken through Line 3-3 of FIG. 1. The connector 10 has a body 28 which may be made of any insulative material, such as a plastic. For example, polycarbonate and acrylic plastics may be particularly suitable for the body 28. The body 28 may be transparent or opaque, depending on the embodiment. As those of skill in the art will understand, having a transparent body may be helpful in that it may create less of a dark spot between two connected strips of linear lighting 12 or between the linear lighting 12 and its wires 14, 16.

The top surface of the body 28 has four partially counterbored holes 30 that are sized to accept machine screws 32. Specifically, the holes 30 each have a raised sidewall that surrounds at least a portion of the head of each of the machine screws 32, although the configuration of the holes 30 may differ in other embodiments.

As can best be seen in the exploded perspective view of FIG. 2, within the body 28 of the connector 10, two primary contact members 34 span the length of the connector 10, bridging between the first side 20 and the second side 22. The primary contact members 34 are electrically conductive, made, for example, of a metal such as a beryllium-copper alloy. On the first side, each primary contact member 34 has a tongue 36 with a slightly upswept end. On the second side, the primary contact member 34 forms a U-shaped cage 38 with a bottom and a pair of upturned sidewalls arising from the bottom. Between the tongue 36 and the cage 38, each primary contact member 34 has an inverted U-shaped portion 40.

The purpose of each portion of the primary contact member 34 can best be appreciated in the cross-sectional view of FIG. 3. The linear lighting 12 rests on the ramp 26, extending into the first side 20, and the solder pads 42 on the upper surface of the linear lighting 12 are slid under the tongues 36 of the primary contact members 34. The inverted U-shaped portion 40 in each primary contact member 34 fits over an internal ridge 44 that arises from the floor of the connector body 28. The engagement of the ridge 44 within the body 28 and the inverted U-shaped portion 40 of each primary contact member 34 helps to secure each primary contact member 34 in place within the body 28. The cage portion 38 of each contact member 34 rests on the floor of the connector body 28 on the second side 22. While the contact members 34 are shown as being single-piece components in the connector 10 of FIGS. 1-3, their function may be performed by several pieces that are in electrical communication with one another. A variation on this concept will be described below in more detail.

The internal contours of the connector body 28 are such that the ramp 24 of the first side 20 lies at a different level than the ramp 26 of the second side 22. As shown in FIG. 3, the screws 32 on the first side 20 are long enough to exert force on the upper sides of the tongues 36 to bias the tongues 36 into engagement with the solder pads 42 of the linear lighting 12. However, the structure is substantially different on the second side 22.

In addition to the primary contact members 34, a pair of upper clips 46 helps to secure the wires 14, 16 on the second side 22 of the connector 10. The upper clips 46 have a flat connecting portion 48 with openings 50 sized to allow the screws 32 to pass. As can be seen particularly in FIGS. 2 and 3, the connecting portion 48 of each upper clip 46 inserts into an inner, upper slot in the connector body 28. As shown in FIG. 2, a pair of screw rails 52 insert into slots 53 in the interior sidewalls of the connector body 28 just under the connection portions 48 of the upper clips 46. The screw rails 52 have threaded holes 54 that complement the threads of the screws 32. Thus, the screws 32 insert through the holes 30 in the body, through the openings 50 in the upper clips 46 and into the threaded holes 54 in the screw rails 52. This secures all of the components in place.

Each of the upper clips 46 has a contact portion 56 that sweeps downwardly and rearwardly, toward the center of the connector body 28. As can best be seen in FIG. 3, the screws 32 of the second side 22 of the connector body 28 bear on the upper surface of the contact portion 56 of the upper clips 46, which drives the contact portion 56 into contact with a wire 14, 16. Thus, each wire 14, 16 is essentially sandwiched between the cage 38 of the primary contact member 34 and the contact portion 56 of the upper clip 46. The screws 32 may be tightened down to exert considerable force in order to keep the components in electrical contact with one another.

The connector 10 of FIGS. 1-3 does not have a notch or other such structure in the first side 20 to accommodate the light engine 18 closest to the connector 10, as do the connectors disclosed in U.S. Pat. No. 10,591,114. Instead, as can best be seen in the cross-sectional view of FIG. 3, the slot that accepts the linear lighting 12 is relatively tall and provides sufficient space for a light engine 18 close to the connector 10.

Connectors according to embodiments of the invention may take various forms in order to connect linear lighting 12 to linear lighting 12, linear lighting 12 to wires 14, 16 or any other combination. These connectors may include, in any combination, the features of the first side 20 or the second side 22.

Figure 4:
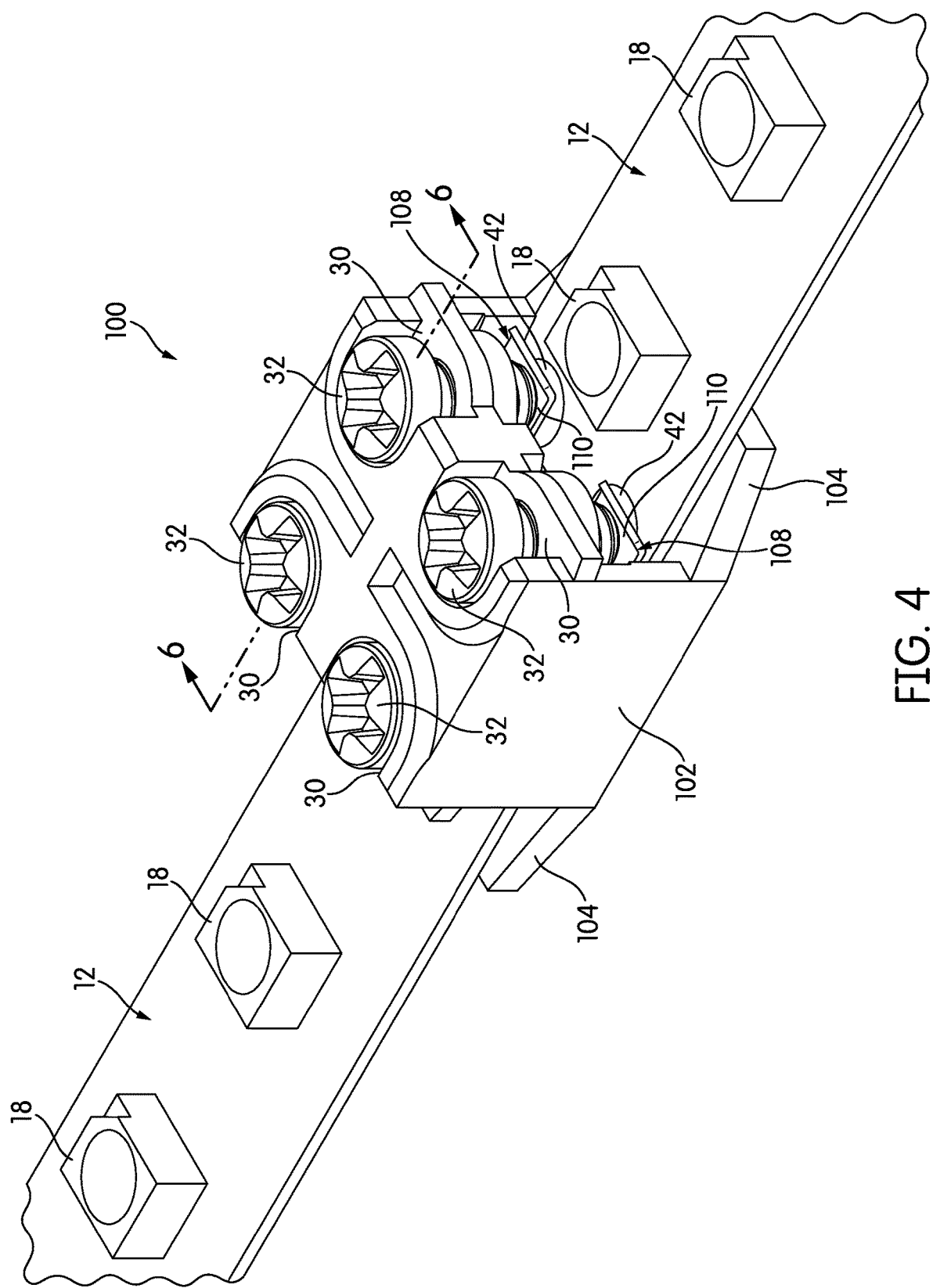
FIG. 4 is a perspective view of a connector for connecting two strips of linear lighting according to another embodiment of the invention.

FIG. 4 is a perspective view of a connector, generally indicated at 100, that connects two strips of linear lighting 20. As will be described below in more detail, the connector 100 of FIG. 4 essentially has the features of two first ends 20. More specifically, the connector body 102 is similar to the connector body 28 described above. As can be seen in the view of FIG. 4, each end of the connector body 102 has a ramp 104. In this embodiment, the ramps 104 are the same length and have the same slope, although that need not be the case in all embodiments. Like the connector 10 described above, the connector 100 provides for two electrical connections, e.g., to positive and neutral terminals, although more or fewer electrical connections may be supported in other embodiments.

Figure 5:
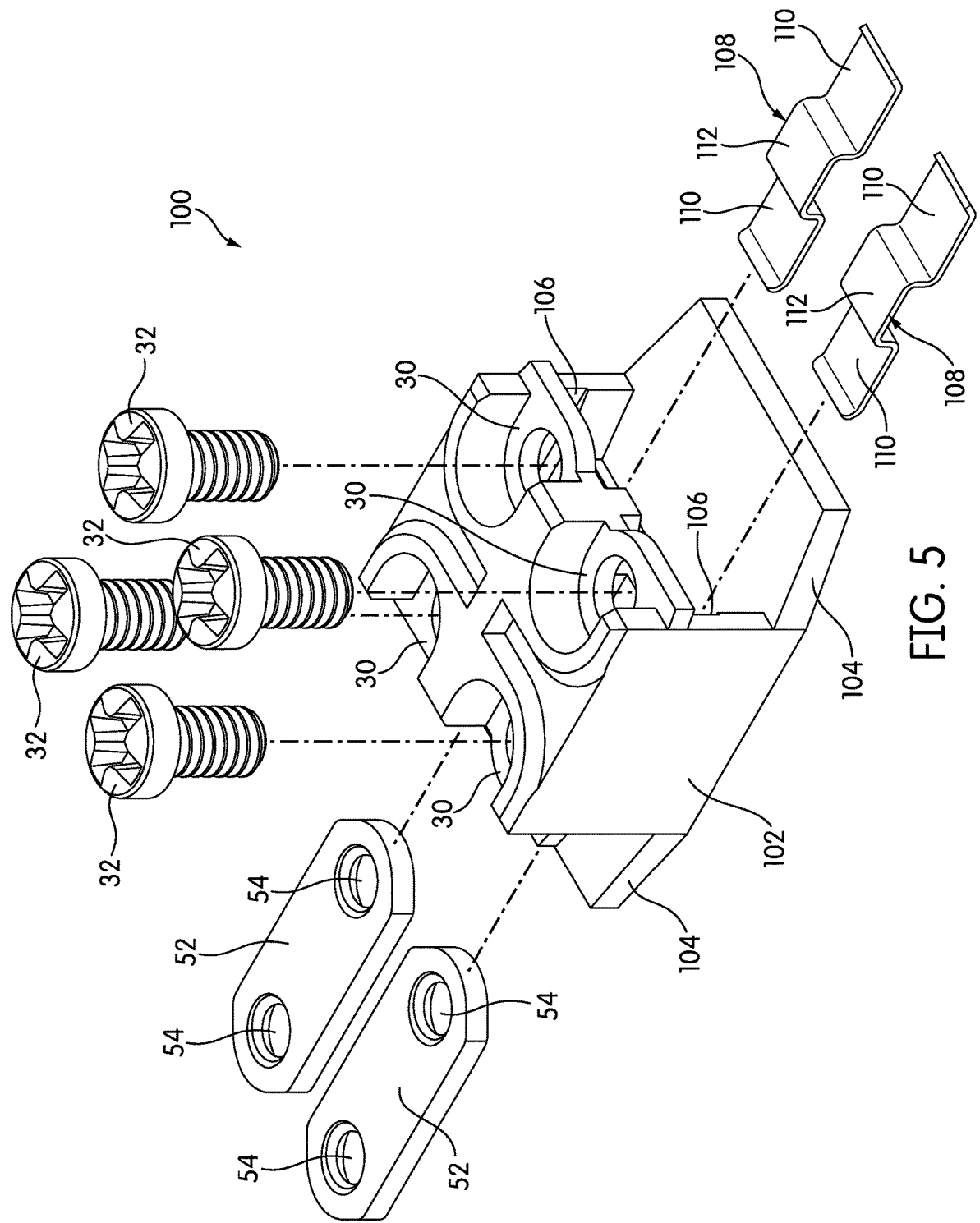
FIG. 5 is an exploded perspective view of the connector of FIG. 4.

FIG. 5 is an exploded view of the connector 100 of FIG. 4 in isolation. The construction of the connector 100 is simpler than the connector 10 of FIGS. 1-3, with fewer parts. More specifically, at the top of the connector 100, machine screws 32 insert into appropriate holes 30, which, like their counterparts described above, have raised sidewalls around a substantial portion of their circumferences. Screw rails 52 with threaded holes 54 insert into slots 106 in the sidewalls of the connector body 102 to receive the screws 32 and secure them in place within the connector body 102.

The only other components to reside within the connector body 102 are the primary contact members 108. In this embodiment, the primary contact members 108 are symmetrical about their long and short axes. Put otherwise, each primary contact member 108 has a tongue 110 on each end, with an inverted U portion 112 in the center.

Figure 6:
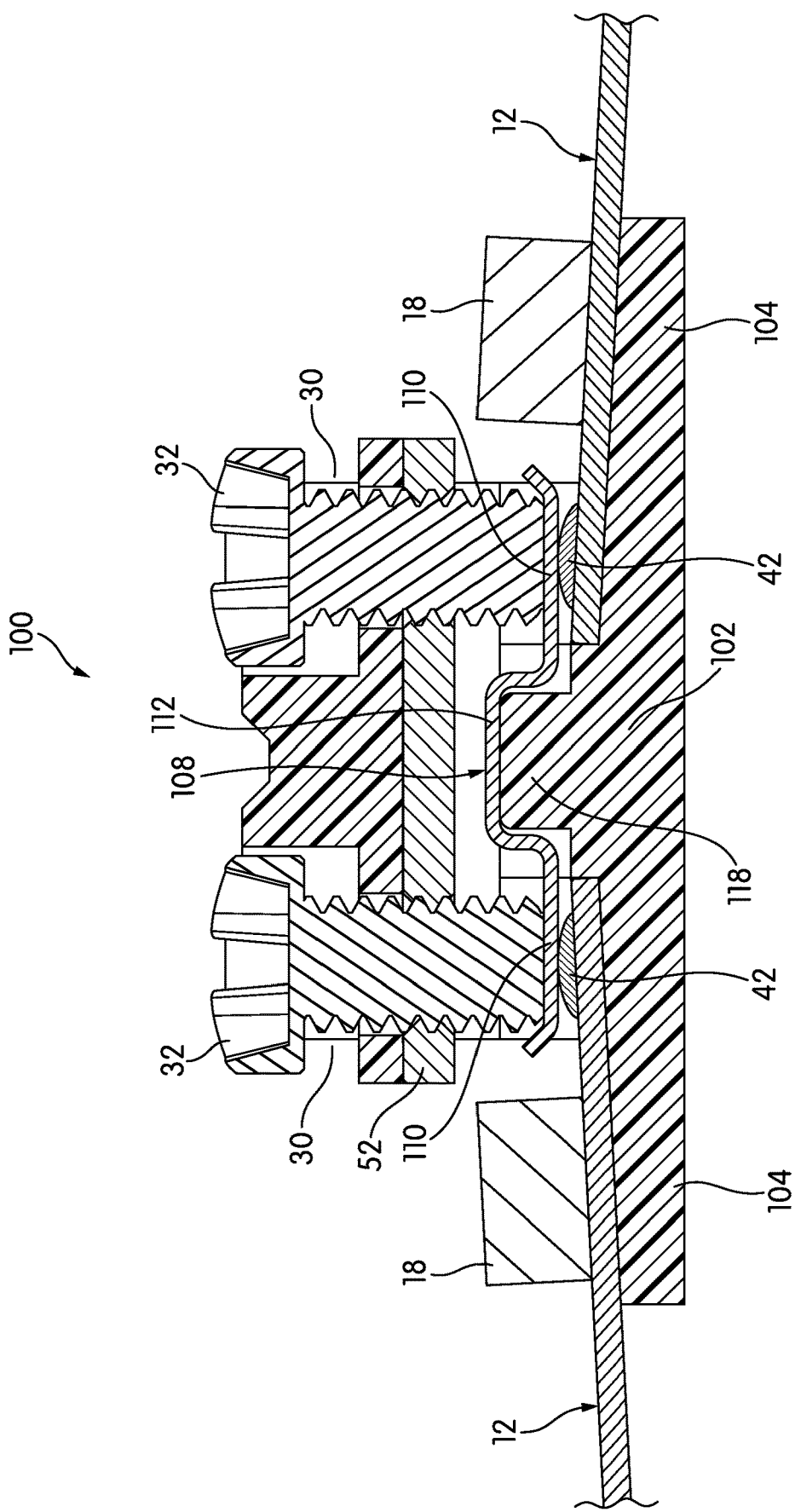
FIG. 6 is a cross-sectional view taken through Line 6-6 of FIG. 4.

FIG. 6 is a cross-sectional view of the connector 100, taken through Line 6-6 of FIG. 4. As shown, the screws 32 bear down on the upper surfaces of the tongues 110 to bias the tongues 110 into contact with the solder pads 42. The inverted U-shaped portion 112 of each primary contact member 108 fits over a raised bar 118 in the floor of the connector body 102.

FIG. 6 shows most clearly that the connector 102 is symmetrical about its centerline, with each side the same. Additionally, the two strips of linear lighting 12 are received at the same vertical height. In other embodiments, the floor of the connector body 28 may be asymmetrical, with one side raised above the other, as in the connector 10 described above.

As was noted briefly above, the connector 100 described here provides for a straight, linear connection between adjacent strips of linear lighting 12. In many applications, it is desirable to turn corners, or to otherwise position one strip of linear lighting 12 at an angle to the last strip of linear lighting 12.

Figure 7:
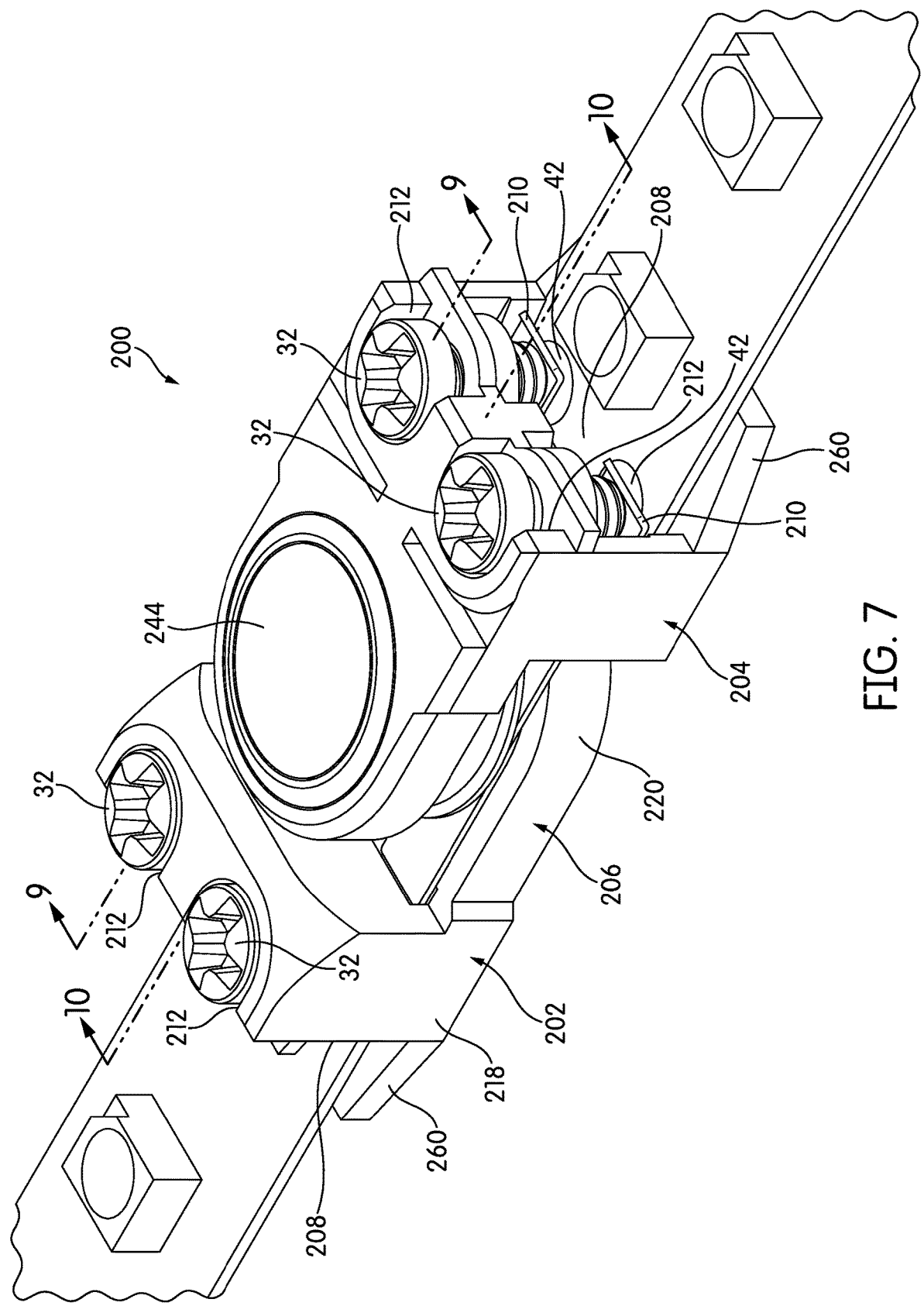
FIG. 7 is a perspective view of a pivoting connector according to yet another embodiment of the invention.

FIG. 7 is a perspective view of a connector, generally indicated at 200, that pivots to allow a range of angles between two connected strips of linear lighting 12. The connector 200 has a first side 202, a second side 204, and a pivot joint 206 between the first side 202 and the second side 204. The pivot joint 206 allows the first side 202 to pivot with respect to the second side 204 (and vice-versa) while maintaining the electrical connection between the two sides 202, 204.

The external configuration of the connector 200 is similar to the other connectors 10, 100 described above. Each side 202, 204 of the connector 200 provides a slot 208 with components to make two electrical connections, e.g., for positive and neutral terminals. As with the other connectors 10, 100, in other embodiments, the connector 200 may support any number of terminals and electrical connections, which may be useful if the LED light engines 18 are RGB light engines, have multiple color temperatures, or have other features that require multiple inputs.

For reasons of compatibility, the first and second sides 202, 204 of the connector 200 have the same structure for receiving and connecting strips of linear lighting 12 as the other connectors. As can be seen in FIG. 7, within the slot 208, two conductive, resilient tongues 210 are biased by respective machine screws 32 into engagement with respective solder pads 42 on the strip of linear lighting 12. The machine screws 32 sit within partially-counterbored holes 212 that have raised sidewalls around much of their circumferences to protect the machine screws 32. Because both ends 202, 204 are adapted to connect strips of linear lighting 12, both sides 202, 204 have identical, or essentially identical, connecting features.

Figure 8:
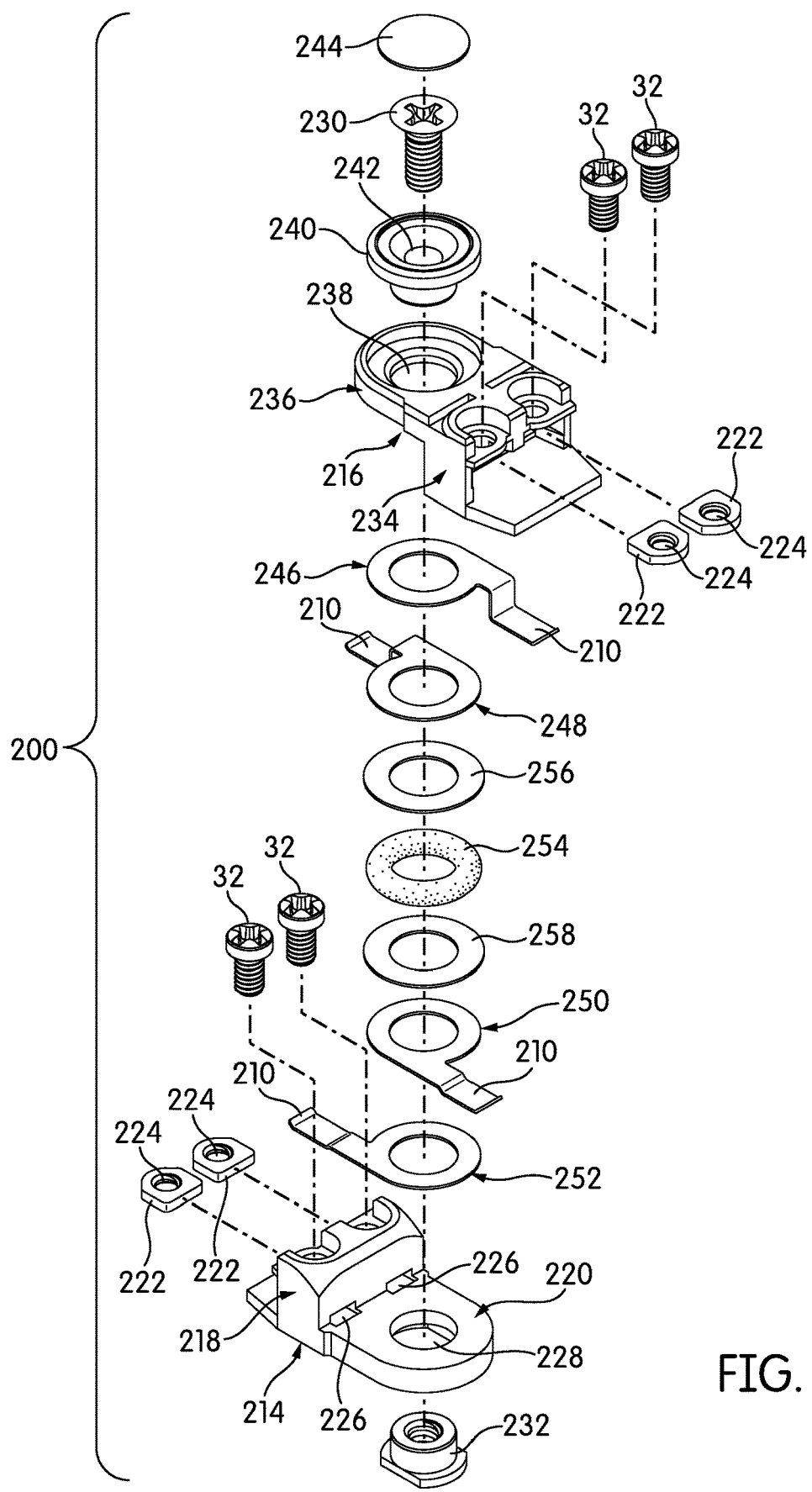
FIG. 8 is an exploded perspective view of the connector of FIG. 7.

Between the first and second sides 202, 204, the electrical connecting structure is substantially different. The components and structure of the connector 200 are better shown in FIG. 8, an exploded perspective view. As shown in FIG. 8, the connector 200 is comprised of a first-side body or housing 214 and a second-side body or housing 216. These two components 214, 216 are made of a nonconductive material, such as a plastic, or of a conductive material that has been selectively insulated or passivated.

The first-side housing 214 and the second-side housing 216 are constructed and adapted to have portions that are stacked vertically to make the pivot joint 206. The first-side housing 214 of this embodiment is intended to be the lower or bottom component of the pivot joint 206. The first-side housing 214 has an LED connecting portion 218 and a pivot-joint portion 220. Near the top of the LED connecting portion 218, screw receiving inserts 222 with threaded holes 224 slide into slots (not shown in FIG. 8) in the interior sidewalls of the LED connecting portion 218 to receive the machine screws.

The two tongues 210 that are biased by the screws 32 into engagement with the solder pads 42 of the linear lighting 12 insert through slots 226 that provide passages between the pivot-joint portion 220 and the LED connecting portion 218. The pivot-joint portion 220 itself is generally U-shaped with a central opening 228 to accommodate the screw 230 that binds the pivot joint 206 together. In the illustrated embodiment, the pivot-joint portion 220 is at about the same vertical position as the bottom of the first-side housing 214, opens down, and accommodates a flanged nut 232 that is sized and otherwise adapted to accept the main screw 230 and to remain in a fixed position within the pivot-joint portion 220 of the first-side housing 214.

The second-side housing 216 also has an LED connecting portion 236 and a pivot-joint portion 236. The LED connecting portion 234 is substantially similar to the LED connecting portion 218 described above. The pivot-joint portion 236 of the second-side housing 216 is approximately level with the top of the second-side housing 216. The pivot-joint portion 236 has a recessed opening 238 that is sized and adapted to carry an insert 240 that has a countersunk opening 242 to accept the main screw 230. A cap 244 presses in over the main screw 230 and is secured in the insert 240.

FIG. 8 also illustrates four contact members 246, 248, 250, 252 that carry the tongues 210 and make electrical contact with the strips of linear lighting 12. In addition to the tongues 210, each of these components has an annular main portion with an opening sized to allow the main screw 230 to pass. In addition to those components, a central insulating member 254 insulates one set of contact members 246, 248 from the other set of contact members 250, 252, thus allowing all of the contact members 246, 248, 250, 252 to be stacked vertically on top of one another. Additionally, washers 256, 258 are positioned overtop and under the central insulating member 254 in order to provide lower-friction bearing surfaces on which the other components 246, 248, 250, 252 can bear and rotate.

Figure 9:
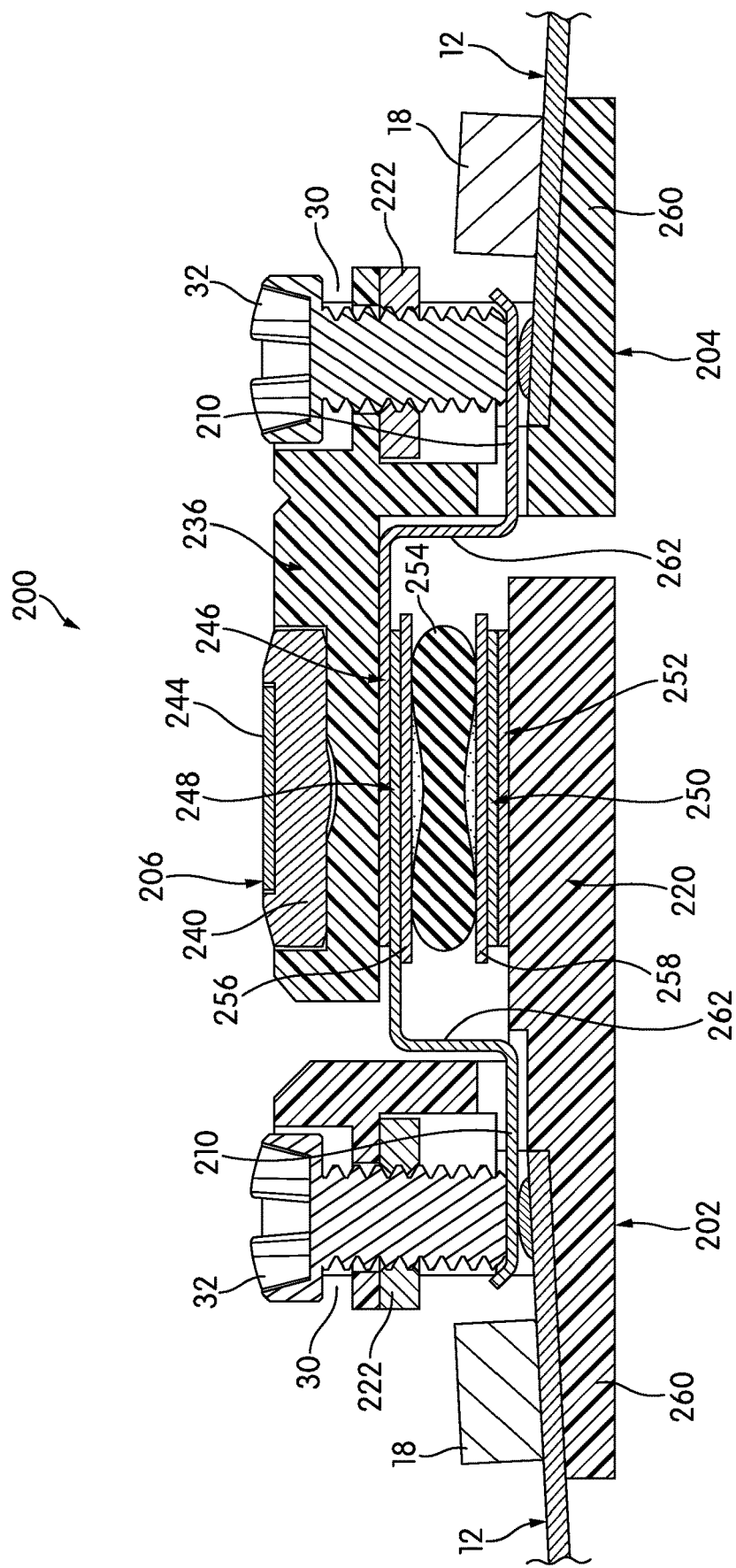
FIG. 9 is a cross-sectional view taken through Line 9-9 of FIG. 7.
Figure 10:
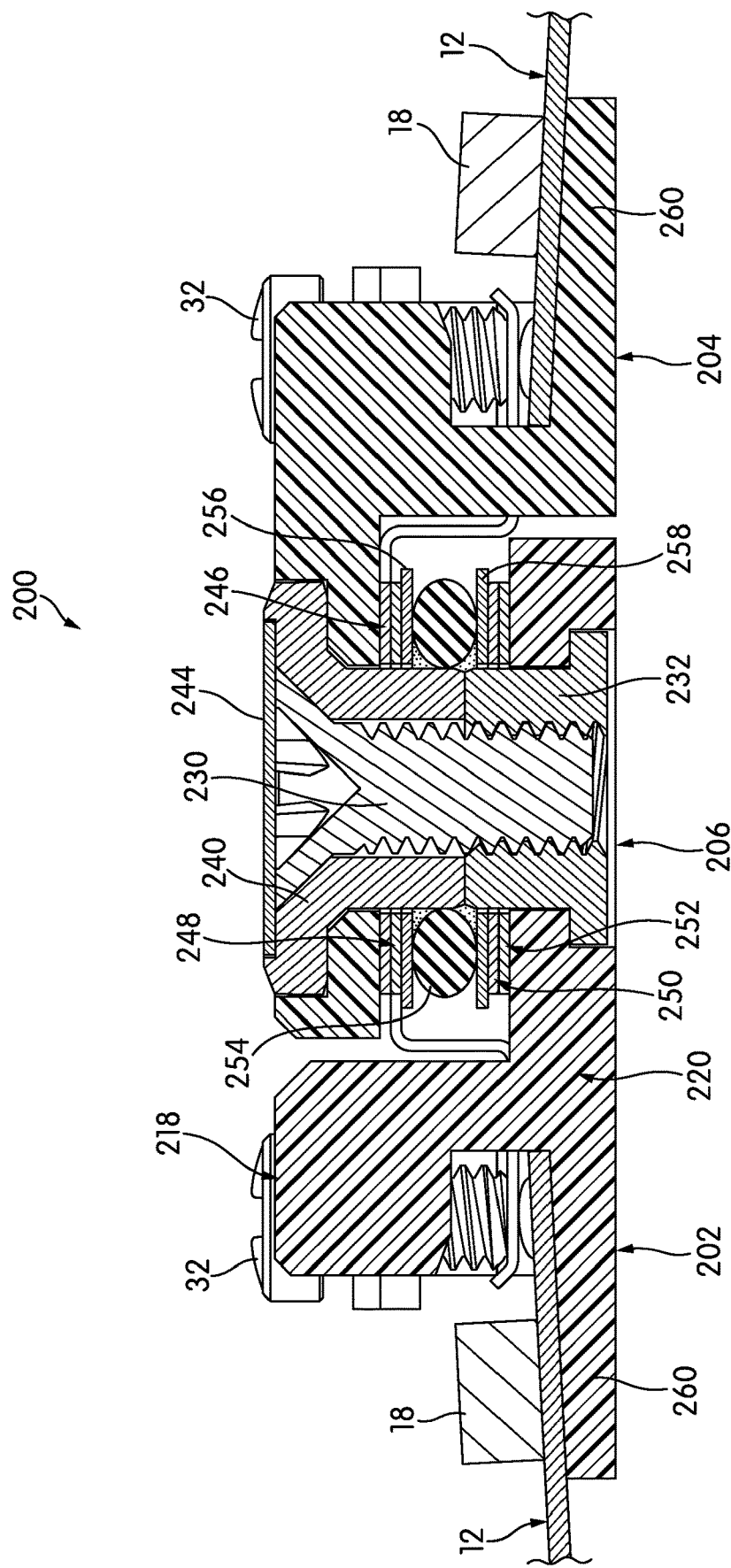
FIG. 10 is a cross-sectional view taken through Line 10-10 of FIG. 7.

The manner in which the pivot joint 206 is assembled is shown in two cross-sectional views, taken through two separate planes, FIG. 9, taken through Line 9-9 of FIG. 7, and FIG. 10, taken through Line 10-10 of FIG. 7.

First, as can be seen in both FIGS. 8 and 9, both the first side 202 and the second side 204 have the sloped ramps 260 of the other connectors 10, 100. While these ramps 260 are advantageous for at least the reasons explained above, as those of skill in the art will understand, the pivoting features of the connector 200 may be present in a connector without a ramp 260.

As shown in FIG. 9, and as was described briefly above, the pivot portion 220 of the first side 202 forms the bottom of the pivot joint 206. The pivot portion 236 of the second side 204 forms the top of the pivot joint 206. Stacked between the pivot portions 220, 236 are, in order from top to bottom, the first pair of contact members 246, 248 that extend between the first and second sides 202, 204; a washer 256; the central insulating member 254; another washer 256; and the second pair of contact members 250, 252.

The central insulating member 254 is a non-conductive annulus or toroid and may be, e.g., a rubber O-ring. While it is shown as having considerable thickness in FIGS. 8 and 9, the central insulating member 254 may be flatter or have a different shape in other embodiments. Preferably, it has at least about the same width as the annular portions of the contact members 246, 248, 250, 252. As was noted briefly above, the purpose of the central insulating member 254 is to physically and electrically separate one set of contact members 246, 248 from the other set of contact members 250, 252. This allows all of the components 246, 248, 250, 252 to be stacked. The washers 256 above and below the central insulating member 254 are somewhat wider than the central insulating member 254 itself, in order to allow the contact members 246, 248, 250, 252 the largest possible bearing surface.

As can also be seen in FIG. 9, while the contact members 246, 248, 250, 252 all have the same contact tongue 210, the contact members 246, 248 each have a vertical step 262 that makes them taller and able to extend down from the top of the pivot joint 206 to the same vertical level as the other contact members 250, 252.

The view of FIG. 10 shows the arrangement of the screw 230, the insert 240 in which the screw 230 is placed, and the nut 232 that captures the screw 230 at its bottom. FIG. 10 also illustrates how the stack of components encircles the screw 230 and the insert 240 and nut 232 that encase the screw 230.

Figure 11:
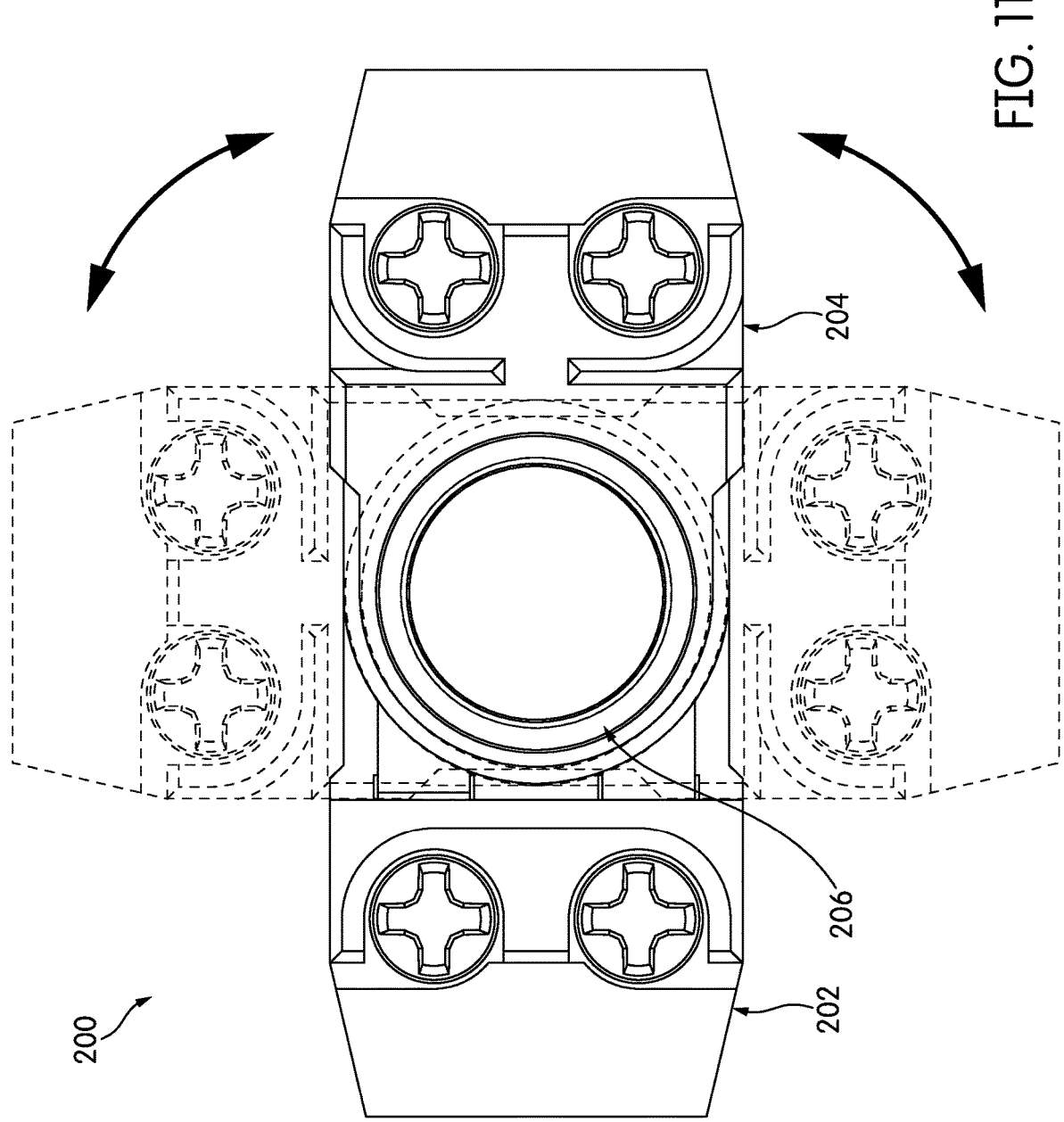
FIG. 11 is a top plan view illustrating the pivoting range of motion of the connector of FIG. 7.

FIG. 11 is a top plan view of the connector 200, illustrating its range of motion. As can be seen in FIG. 11, the two sides 202, 204 of the connector 200 may be positioned in-line with one another or at any angle between 0° and 90°. The position of the two sides 202, 204 is established and maintained by frictional forces that depend on how tightly the screw 230 is secured. However, in other embodiments, the pivot joint 206 may be arranged with detents or other such structures that establish specific angular positions. Additionally, while a screw 230 is used in the connector 200, other fastening means and members may be used, including various types of pins.

Figure 12:
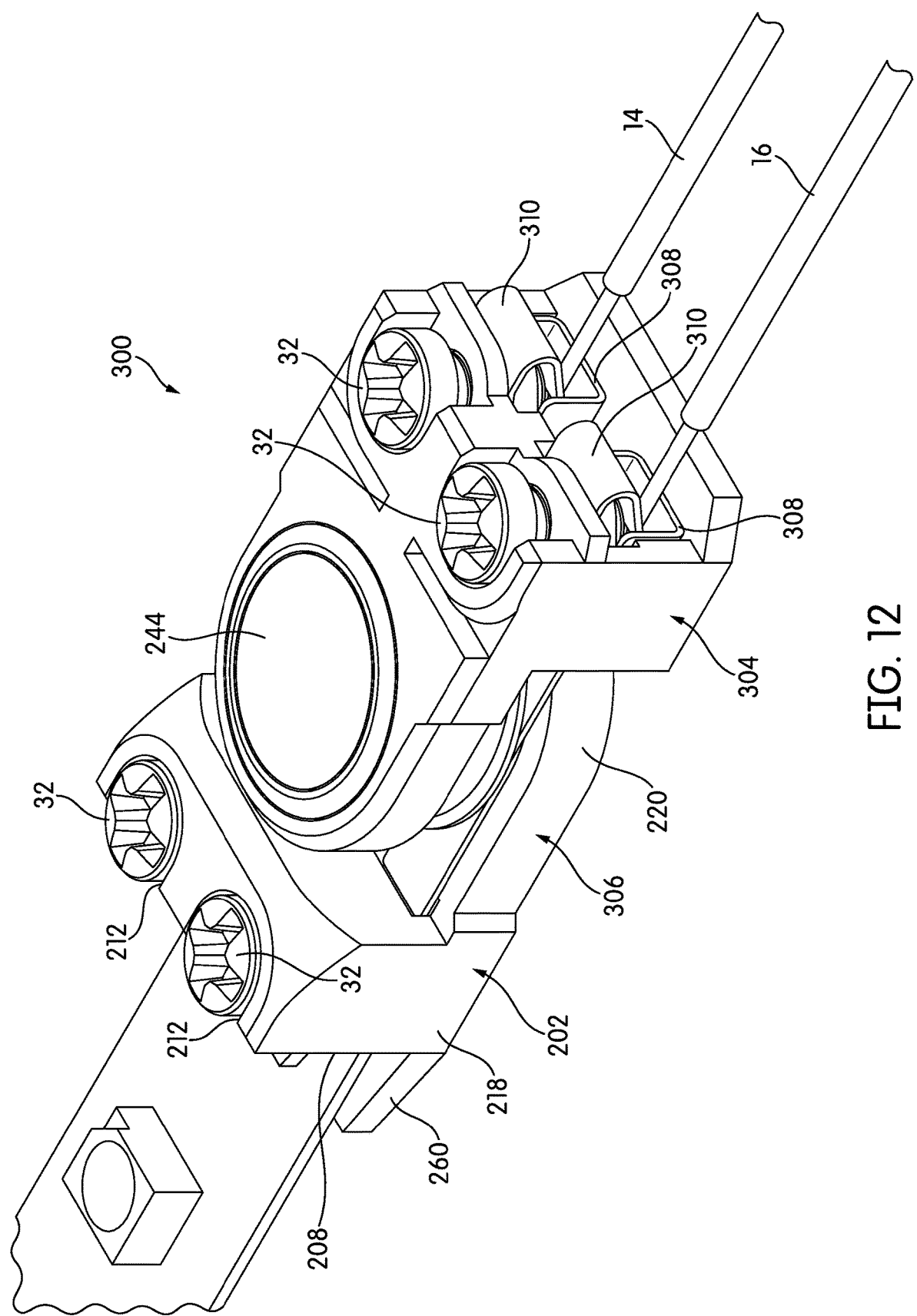
FIG. 12 is a perspective view of a pivoting connector that connects between a strip of linear lighting and wires.

As those of skill in the art will appreciate, the connector 200 illustrated in FIGS. 7-11 is intended to connect two strips of linear lighting 12. However, a connector could be constructed using the same principles to pivotably connect a strip of linear lighting 12 to wires 14, 16. To that end, FIG. 12 is a perspective view of a connector, generally indicated at 300, that connects a strip of linear lighting 12 to wires 14, 16. The first side 202 of the connector 300 is identical to the first side 202 of the connector 200 described above. The pivot joint 306 is similar to the pivot joint 206 described above, with contact members connected to each side 202, 304 vertically stacked around a central pivot. The primary difference between the connector 200 and the connector 300 of FIG. 12 is that the second side 304 of the connector 300 has cages 308 and upper clips 310 to make contact with the wires 14, 16, instead of the tongues 210 carried by both sides 202, 204 of the connector 200. Although the wires 14, 16 themselves can bend, and thus, a connector like the connector 300 of FIG. 12 may not be necessary in all embodiments, a pivoting connector 300 may alleviate wire strain.

While the invention has been described with respect to certain embodiments, the description is intended to be exemplary, rather than limiting. Modifications and changes may be made within the scope of the invention, which is defined by the appended claims.

What is claimed is:

1. A connector, comprising:
 a first side including a first slot adapted to accept a strip of linear lighting;
 a second side adapted to connect to wires or to a second strip of linear lighting;
 a pivot joint connecting the first side and the second side and allowing relative rotation between them, the pivot joint comprising, in a stack:
 a conductive first contact member, the first contact member having a first open portion and a first contact portion that extends into the first slot of the first side;
 a conductive second contact member in electrical contact with the first contact member, the second contact member having a second open portion and a second contact portion that extends into the second side;
 a conductive third contact member, the third contact member having a third open portion and a third contact portion that extends into the first slot of the first side; and
 a conductive fourth contact member in electrical contact with the third contact member, the fourth contact member having a fourth open portion and a fourth contact portion that extends into the second side;
 a nonconductive central insulating member, the central insulating member constructed and arranged to electrically isolate the first and second contact members from the third and fourth contact members; and
 a fastening member extending through the first open portion, the second open portion, the third open portion, and the fourth open portion, a long axis of the fastening member defining an axis of rotation of the pivot joint.

2. The connector of claim 1, wherein the first open portion, the second open portion, the third open portion, and the fourth open portion comprise annuluses.

3. The connector of claim 1, wherein the first contact portion and the third contact portion are spaced and electrically isolated from one another in the first slot.

4. The connector of claim 1, further comprising washers above and below the central insulating member in the vertical stack.

5. The connector of claim 1, wherein one or both of the first side or the second side include a tapered ramp extending outwardly from one or both of the first slot or the second slot.

6. The connector of claim 1, wherein the second side includes a second slot to accept the second strip of linear lighting; and
 the second contact portion and the fourth contact portion extend into the second slot.

7. The connector of claim 6, wherein the central insulating member comprises an annulus or a toroid.

8. The connector of claim 6, wherein the second contact portion and the fourth contact portion are spaced and electrically isolated from one another in the second slot.

9. The connector of claim 8, wherein the first contact portion, the second contact portion, the third contact portion, and the fourth contact portion each comprise a tongue.

10. The connector of claim 1, wherein the fastening member is a screw.

11. The connector of claim 10, further comprising a nut adapted to be secured in the first side or the second side, the nut receiving the screw.

12. The connector of claim 8, wherein the second contact portion and the fourth contact portion comprise cages adapted to accept wires.

13. The connector of claim 12, further comprising first and second upper clips installed in an upper portion of the second side, corresponding to positions of the second contact portion and the fourth contact portion.

* * * * *